(12) United States Patent
Garcia et al.

(10) Patent No.: US 8,461,541 B2
(45) Date of Patent: Jun. 11, 2013

(54) RADIATION DETECTOR, METHOD OF MANUFACTURING A RADIATION DETECTOR AND USE OF THE DETECTOR FOR MEASURING RADIATION

(75) Inventors: Francisco Garcia, Helsinki (FI); Risto Orava, Helsinki (FI); Manuel Lozano, Barcelona (ES); Giulio Pellegrini, Barcelona (ES)

(73) Assignee: FinPhys Oy (FI)

( * ) Notice: Subject to any disclaimer, the term of this patent is extended or adjusted under 35 U.S.C. 154(b) by 285 days.

(21) Appl. No.: 12/794,627

(22) Filed: Jun. 4, 2010

(65) Prior Publication Data

US 2011/0079728 A1 Apr. 7, 2011

Related U.S. Application Data

(63) Continuation of application No. PCT/EP2008/066716, filed on Dec. 3, 2008.

(30) Foreign Application Priority Data

Dec. 4, 2007 (FI) ..................................... 20070939

(51) Int. Cl.
*G01T 1/24* (2006.01)
*H01L 31/115* (2006.01)
(52) U.S. Cl.
USPC ..................................... 250/370.01; 257/429
(58) Field of Classification Search
USPC ............... 250/370.01, 370.05, 370.14, 385.1, 250/483.1; 257/428, 429
See application file for complete search history.

(56) References Cited

U.S. PATENT DOCUMENTS

| 6,259,099 | B1 | 7/2001 | Foulon et al. |
| 6,943,409 | B1 | 9/2005 | Cheng et al. |
| 2003/0122210 | A1 | 7/2003 | Cohen et al. |
| 2005/0017185 | A1* | 1/2005 | King .................. 250/370.05 |

FOREIGN PATENT DOCUMENTS

| DE | 10127952 A1 | 12/2002 |
| EP | 1833095 A | 9/2007 |
| FR | 2656738 A | 7/1991 |
| FR | 2666453 A | 3/1992 |
| JP | 56129380 | 10/1981 |

OTHER PUBLICATIONS

International Search Report for PCT/EP2008/066716 Mailed Jul. 17, 2009.

\* cited by examiner

*Primary Examiner* — Mark R Gaworecki
(74) *Attorney, Agent, or Firm* — Knobbe, Martens, Olson & Bear LLP

(57) ABSTRACT

A radiation detector is disclosed. The detector has an entrance opening etched through a low-resistivity volume of silicon, a sensitive volume of high-resistivity silicon for converting the radiation particles into detectable charges, and a passivation layer between the low and high-resistivity silicon layers. The detector also has electrodes built in the form of vertical channels for collecting the charges generated in the sensitive volume, and read-out electronics for generating signals based on the collected charges.

23 Claims, 6 Drawing Sheets

Sensitive layer thickness for different particle types and particle energies

| Energy / Particle type | 20 keV | 30 keV | 40 keV | 50 keV | 100 keV | 200 keV | 500 keV | 1 MeV | 2 MeV | 3 MeV | 4 MeV |
|---|---|---|---|---|---|---|---|---|---|---|---|
| p | 0,5 μm 2608Å | 0,5μm 3529Å | 0,5 μm 4369Å | 1 μm 5159Å | 1 μm 8953Å | 2 μm 1,74 μm | 6 μm 5,96 μm | 15 μm 14,97 μm | 45 μm 43,46 μm | 100 μm 83,83 μm | 200 μm 135,45μm |
| d | 0,5 μm 3277Å | 0,5 μm 4508Å | 1 μm 5588Å | 1 μm 6569Å | 1 μm 1,08μm | 2 μm 1,85 μm | 5 μm 4,56 μm | 12 μm 11,03μm | 30 μm 30,14 μm | 60 μm 55,72 μm | 90 μm 87,38 μm |
| t | 0,5 μm 3683Å | 1 μm 5142Å | 1μm 6434Å | 1 μm 7602Å | 2 μm 1,24 μA | 2 μm 2,04μm | 5 μm 4,47 μm | 10 μm 9,74μm | 30 μm 24,93μm | 50 μm 45,33μm | 100 μm 98,59μm |
| α | 0,5 μm 1979Å | 0,5 μm 2800Å | 0,5 μm 3539Å | 0,5 μm 4199Å | 1 μm 6909 Å | 1 μm 1,09 μm | 2 μm 2,00 μm | 4 μm 3,40 μm | 8 μm 6,68 μm | 10 μm 10,86μm | 25 μm 21,83 μm |

FIG. 3

RADIATION DETECTOR, METHOD OF MANUFACTURING A RADIATION DETECTOR AND USE OF THE DETECTOR FOR MEASURING RADIATION

CROSS-REFERENCE TO RELATED APPLICATIONS

This application is a continuation of PCT/EP2008/066716, filed Dec. 3, 2008, which was published in English and designated the U.S., and claims priority to FI 20070939, filed Dec. 4, 2007, each of which are incorporated herein by reference.

BACKGROUND OF THE INVENTION

1. Field of the Invention

The invention is concerned with a silicon detector for detecting high-intensity radiation particles. The silicon detector used comprises a silicon wafer having an entrance opening in low-resistivity silicon, and a passivation layer of silicon dioxide and a sensitive volume of high-resistivity silicon for converting the radiation particles into detectable charges. Furthermore, the detector comprises electrodes built in the form of vertical channels etched into the sensitive volume for collecting the charges, and read-out electronics for generating electrical signals from the collected charges. The invention is also concerned with a method of manufacturing a radiation detector and the use of the detector for measuring radiation.

2. Description of the Related Art

In experimental and applied particle physics, a particle detector, also known as a radiation detector, is a device used to detect, track, and/or identify high-energy particles, such as particles produced by nuclear decay, cosmic radiation, or reactions in a particle accelerator. An accelerator is a device (i.e. machine) used to produce such high-energy particles, which are high-speed beams or pulses of charged particles, such as electrons, protons, or heavy ions, for research in high-energy and nuclear physics, synchrotron radiation research, medical therapies, and some industrial applications.

The particle pulses to be detected can be generated by laser-plasma interaction by different plasma shot techniques. In physics and chemistry, plasma is typically an ionized gas. Plasma is considered to be a distinct state of matter, apart from gases, because of its unique properties and is typically formed by heating and ionizing a gas, stripping electrons away from atoms, thereby enabling the positive and negative charges to move more freely.

"Ionized" refers to presence of one or more free electrons, which are not bound to an atom or molecule and ionization is the process by which a neutral atom or molecule acquires a positive or negative charge. The free electric charges make the plasma electrically conductive so that it responds strongly to electromagnetic fields.

Radiation as used in physics, is energy in the form of waves or moving subatomic particles. Radiation can be classified as ionizing or non-ionizing radiation, depending on its effect on atomic matter. Ionizing radiation has enough energy to ionize atoms or molecules while non-ionizing radiation does not. Radioactive material is a physical material that emits ionizing radiation.

Ionizing radiation has enough energy to eject from electrically neutral atoms, leaving behind charged atoms or ions. There are four basic types of ionizing radiation: Alpha particles (helium nuclei), beta particles (electrons), neutrons, and gamma rays (high frequency electromagnetic waves, x-rays, are generally identical to gamma rays except for their place of origin.) Neutrons are not themselves ionizing but their collisions with nuclei lead to the ejection of other charged particles that do cause ionization.

As human sense is unable to react to ionizing radiation, detectors are used to detect its presence. With a detector it is possible to determine the type of radiation, measure its energy and register other parameters. Modern detectors are also used as calorimeters to measure energy of the detected radiation. They may also be used to measure other attributes such as momentum, spin, charge etc. of the particles.

There are dedicated detectors for different type of radiation. To detect radiation, one utilizes the interaction process with matter where the interacting medium converts the invisible radiation to detectable signals. If the radiation consists of charged heavy particles, such as alphas, or light ones, like electrons or positrons, the electromagnetic interaction create charges which can be collected and detected. It can also initiate further processes, which can give rise to registable signals in the detector medium. The neutral gamma radiation interacts with matter with electromagnetic processes and transfer part or all its energy to electrons. To register other neutral particles, like neutrons similar processes are relied on. The radiation has to interact with matter and transfer its energy to charged particles (electrons) and then the detection process mentioned above.

All detectors use the fact that the radiation interacts with matter, mostly via ionization. The detector converts deposited energy of the ionizing radiation to registered signals, usually electric signals. The interaction with the radiation takes place in an interacting medium and creates charges that are collected and detected.

Many of the detectors invented and used so far are ionization detectors (of which gaseous ionization detectors and semiconductor detectors are most typical) and scintillation detectors; but other, completely different principles have also been applied, like Cherenkov light and transition radiation.

The most widely used type of detectors is based on the effect produced when a charged particle passes through a gas. The charged particle will along its track through the gas ionize the gas molecules. The energy needed to create an electron pair in gases is in the order of 30 eV and depends on the type of gas. If an electric field is applied, the created charge will be collected on the electrodes resulting in an electric pulse, which contains the total collected charge and thus the absorbed energy of the electrons.

The functionality of a semiconductor or solid state detector is analogous to gas ionization devices. Since the basic information carriers are the electron hole pairs created along the path of the ionizing particle, the charge per unit length will be higher than in the gaseous detection chamber.

A semiconductor detector is a device that uses a semiconductor (usually silicon or germanium) to detect traversing charged particles or the absorption of photons. The density of the ionizing medium, the semiconductor material, is some 1000 times greater than for a gas. In addition, the energy needed to create an electron-hole pair is ten times lower, i.e. 3,7 eV for Si and 2,9 eV for Ge. In the field of particle physics, these detectors are usually known as silicon detectors. When their sensitive structures are based on a single diode, they are called semiconductor diode detectors. When they contain many diodes with different functions, the more general term semiconductor detector is used. Semiconductor detectors have found broad application during recent decades, in particular for gamma and X-ray spectrometry and as particle detectors.

In these detectors, radiation is measured by means of the number of charge carriers set free in the detector, which is arranged between two electrodes. The number of the free electrons and the holes (electron-hole pairs) produced by the ionizing radiation is proportional to the energy transmitted by the radiation to the semiconductor. As a result, a number of electrons are transferred from the valence band to the conduction band, and an equal number of holes are created in the valence band. Under the influence of an electric field, the electrons and the holes travel to the electrodes, where they result in a pulse that can be measured in an outer circuit. The holes travel into the opposite direction than the electrons and both can be measured. As the amount of energy required to create an electron-hole pair is known, and is independent of the energy of the incident radiation, measuring the number of electron-hole pairs allows the energy of the incident radiation to be found.

The energy required for production of electron-hole-pairs is very low compared to the energy required for production of paired ions in a gas detector. Consequently, in semiconductor detectors, the statistical variation of the pulse height is smaller and the energy resolution is higher. As the electrons travel fast, the time resolution is also very good, and is dependent upon rise time. Compared with gaseous ionization detectors, the density of a semiconductor detector is very high, and charged particles of high energy can give off their energy in a semiconductor of relatively small dimensions.

In microelectronics, a wafer is a thin slice of semiconducting material, such as a silicon crystal, upon which microcircuits are constructed by doping (for example, diffusion or ion implantation), chemical etching, and deposition of various materials. Wafers are thus of key importance in the fabrication of semiconductor devices such as integrated circuits.

Most silicon particle detectors work, in principle, by doping narrow (usually around 100 micrometers wide) strips of silicon to make them into diodes, which are then reverse biased. A diode is a component that restricts the directional flow of charge carriers. Essentially, a diode allows an electric current to flow in one direction, but blocks it in the opposite direction. As charged particles pass through these strips, they cause small ionization currents which can be detected and measured. Arranging thousands of these detectors around a collision point in a particle accelerator can give an accurate picture of what paths particles take.

Silicon detectors have a much higher resolution in tracking charged particles than older technologies such as cloud chambers or wire chambers. The drawback is that silicon detectors are much more expensive than these older technologies and require sophisticated cooling to reduce leakage currents (noise source) as well as suffer degradation over time from radiation.

Also a scintillation counter can measure ionizing radiation. The sensor, called a scintillator, consists of a transparent crystal, usually phosphor, plastic or organic liquid that fluoresces when struck by ionizing radiation. A sensitive photomultiplier tube (PMT) measures the light from the crystal. The PMT is attached to an electronic amplifier and other electronic equipment to count and possibly quantify the amplitude of the signals produced by the photomultiplier Scintillation counters are widely used because they can be made inexpensively yet with good quantum efficiency. The quantum efficiency of a gamma-ray detector depends upon the density of electrons in the detector, and certain scintillating materials, such as sodium iodide and cesium iodide activated thallium, achieve high electron densities as a result of the high atomic numbers of some of the elements of which they are composed.

Scintillators often convert a single gamma, ion or a neutron of high energy radiation into high number of lower-energy photons, where the number of photons per unit of absorbed energy is fairly constant. By measuring the intensity of the flash (the number of the photons produced by the incoming radiation) it is therefore possible to discern the original particle's energy.

There are many different types of CsI(Tl) crystals for the different channels of e.g. a Neutral Particle Analyzer (NPA), which is a detector for detection of neutral radiation. The crystals of CsI(Tl) are used as wafer and are optically connected to photomultipliers. They are made in various sizes ranging from 1 inch (25.4 mm) to 11.8 inches (300 mm), and thicknesses of the order of 0.5 mm.

As a result of the increase in the power of the plasma shots used today for producing ionized particles to be detected, these detectors becomes saturated and consequently made them useless for the measuring and neither is the energy resolution good enough to resolute different ion components. These detectors can not operate at higher count rates than 100 kHz, mainly due to the CsI(Tl) scintillation time of about 1 microsecond, i.e. they do not allow to carry out pulse high analysis of ion signals under the intensive gamma and neutron background. The crystals of CsI(Tl) can not even without any damaged operate at a higher count rate (at intense radiation) due to the long scintillation constant of the scintillator itself.

There are two mechanisms interplaying here. Damage cause that the material is not able to work as before and count rate is another problem when the detectors get saturated by the quantity of particles hitting it. These mechanisms are not related to each other. Here, with radiation hardness, in fact radiation resistance to such a field is meant. As a consequence of the radiation damage, the energy resolution is worsened and the amplitude of the interested particles become too small that can not be separated from the background signals, which is called degradation of the signal-to-noise ratio. The reason for the problem arising with is thus that they have a long scintillation time constant, as a consequence of which signals can not be integrated in short time and a low count rate have to be used.

U.S. Pat. No. 5,552,596 is mentioned as prior art. It presents a three-dimensional radiation detection device for detecting X and gamma radiation. An array of electrodes penetrates into the substrate bulk of a thickness of some hundreds microns.

The article "Technology development of 3-D Detectors for High Energy physics and Imaging by Giulio Pellegrini et al (Department of electronics and electrical Engineering, Glasgow University, G128QQ UK presents a tree-dimensional array of electrodes penetrated into the detector bulk. A layer of silicon of about 200 microns thick is used. The advantages of this structure include short collection distances, fats collection times and low depletion voltages depending on the electrode diameter and pitch chosen.

A problem in conventional semiconductor detectors arises when high-intensive radiation such as $10^{10}$-$10^{11}$ neutrons/$cm^2$ is measured because of the intrinsic damage suffers by the silicon bulk of the sensitive volume. The damage correlate with the detector thickness this means for larger thickness damage has larger probability, so in another words damage scales with thickness.

The radiation that hit the detector has time to destroy the detector and induce damages in the sensitive silicon layer, wherein the electrons and holes are intended to be formed. The silicon wafer, however, has to be constructed so that the capacitance would be low enough. Also technological problems have set it limitations to the structure of the wafers. Therefore, such high-intense radiation can not be measured with conventional semiconductor and silicon detectors.

The detection of light ions is very difficult as any material in the input window can reduce the energy, and even stop the incoming ions. Standard radiation detectors work in full depletion regime, and this requires the use of electrodes at both sides of the detecting bulk. Therefore it is needed a metallic electrode, acting as backside contact, in the ion input window. Other authors [Tindall et al.] have proposed the use of ultra-thin metal layers.

U.S. Pat. No. 6,259,099 presents an ultra-thin ionizing radiation detector using such electrical contacts at both sides of the detecting volume. It is necessary to apply a voltage between the two electrodes to have an electrical signal. The metals are at the top and bottom surfaces. The voltage is applied vertically. The use of a metal layer in the entrance window is a hinder for detecting ions with low energy and this is due to the thickness of their entrance window.

A second problem with conventional silicon detectors and semiconductor detectors is that when the intention is to measure p (protons), d (deuterons), t (tritons) and a particles, the background radiation containing neutrons and gamma particles should be eliminated. Conventional semiconductor silicon detectors are not sensitive enough to distinguish between the desired particles and the neutrons and gamma particles since they give more energy to the detected signal than the intended measurements. There are many kinds of different particles to be detected in plasma. When there are intense gamma and neutron backgrounds it is therefore difficult to identify different types of incident particles created in the plasma.

The object of the invention is a detector with which high-intense radiation can be measured and which is sensitive enough for distinguishing signals caused by p (protons), d (deuterons), t (tritons) and a particles, form background radiation containing neutrons and gamma particles.

SUMMARY OF THE INVENTION

The silicon detector of the invention for detecting high-intensity radiation or particles, comprises a silicon wafer having an entrance opening etched through a low-resistivity volume of silicon, a sensitive volume of high-resistivity silicon for converting the radiation particles into detectable charges, and a passivation layer between the low and high-resistivity silicon layers. The detector further comprises electrodes built in the form of vertical channels for collecting the charges etched into the sensitive volume, and read-out electronics for generating signals from the collected charges. The detector is mainly characterized in that it is constructed to take in the radiation or particles to be detected directly through the passivation layer and in that the thickness of the sensitive layer having been selected as a function of the mean free path of the particles to be detected.

The detector can e.g. furthermore have a polyethylene moderator at the entrance window for detection of neutrons.

The electrodes are e.g. of polysilicon of n and p type and made with Schottky contact.

In the method of the invention for manufacturing such a detector a semiconductor-on-insulator (SOI) wafer, which comprising two outmost layer of n-type silicon and an intermediate layer of silicon dioxide, is used. The method is mainly characterized by the steps of selecting the thickness of one the silicon layer to be the sensitive layer at the front surface as a function of the mean free path of the particles to be detected, growing or depositing an insulation layer on both surfaces of the wafer by leaving open a window, etching holes into the layer to constitute the sensitive layer to reach the silicon oxide layer, doping the holes to create electrodes, depositing and patterning a metal layer at the front surface of the wafer and routing the metal layer to read-out electronic, and forming a window in the back surface of the wafer to reach the silicon oxide layer.

The detector of the invention can be used e.g. for detecting high-intensity radiation particles by having radiation or particles entering through the entrance window into the detector, ionizing the neutral atoms within the sensitive volume of high-resistivity silicon, applying a voltage between electrodes etched into the sensitive volume, and detecting the signals caused as a result of the contact with the electrodes by means of read-out electronic.

It can also be used for detecting high-intensity radiation in a Neutral Particle Analyzer (NPA), for Neutron detection in connection to Alpha Particle Induced reactions, Spontaneous Fission, Induced Fission, for Low energy X-ray detection, for High Energy X- and gamma-ray detection and/or for detection of Low energy heavy ions.

Different embodiments of the detector and the method of the invention are presented in the sub claims.

An exact relationship for how the sensitive layer having been selected as a function of the mean free path of the particles to be detected is presented in FIG. 3 in the detailed description part of this text.

There is furthermore preferably a polyethylene moderator at the entrance window for detection of neutrons. The polyethylene is use to slow down the energy of the neutrons then after they will interact with the bohr and generate alpha particles, which will be detected with the detector. Thus, polyethylene is used as a moderator in order to reduce energy. In other words, when the energy of the neutrons is low, they can interact via inelastic nuclear reactions and produce alpha particles. These particles will stop completely in the detector and signals can be detected.

The passivation layer is important only in connection with low energy particles (<100 keV).

Sometimes with detector thickness, the sum of the sensitive volume (varies with respect to the particle and their energy) plus the supporter layer (300 microns) is meant. But in the invention, it is the sensitive layer thickness that is important.

The detector of the invention is optimized for detecting heavy particles and filtrate neutrons and gamma particles. It can withstand high radiation rates and it does not become saturated as easily as conventional detectors. Different particles can be detected. The capability to withstand high radiation rates is necessary e.g. for managing fusion reactors. The innovative approach of this configuration is the use of 3D technology of columnar electrodes inside the semiconductor bulk with an ultra thin detector made in a Silicon On Insulation (SOI) wafer. Due to the small detector thickness, it is "transparent" to the background particles, ie, these particles generate very small signals, below the detection threshold or they do not interact at all, whilst the heavy particles are fully stopped in the detector bulk, generating signals read through the readout electronics.

3D columnar electrodes are used to avoid the need of a contact layer in the particle entry window. The electrical contacts (the electrodes) are the columns. There are two types of columns for positive and negative voltage alternated. The voltage is applied horizontally, and then there is no need for the metal at the entry window.

Moreover, the window passivation layer can have a thickness in the range of only a few nanometers. The columnar structure allows a very fast charge collection, which is essential for high counting rates needed in the case of high intensity particle flow. Finally, the columnar electrodes allow a very high radiation hardness.

The use of an Silicon On Insulation (SOI) wafer in order to separate the active high resistivity material from the inactive low resistivity material will reduce the effect of charging and polarization after long exposure to heavy ions fluencies.

The silicon detector of the invention can with stand fluencies of $10^{15}$ particles/cm$^2$ without significant degradation of the charge collection efficiency.

The invention uses a thin silicon wafer in the sensitive volume (a few tens of microns) in order to reduce the sensitivity to background radiation present in plasma. At the same time, the detector will have close to 100% efficiency for detection of ions. The three-dimensional electrode structure is primarily used to avoid the contact layer of the entry window and also to reduce the transit time of the generated charge carriers in the sensitive volume to allow a higher count rate and improve the radiation hardness. With the invention, even count rates in the Megahertz (MHz) scale can be used, compared to the 100 kHz with the detectors of prior art. This will give an increase of the factor of 10-100 times. The capability of the detector is thus improved a lot. The detector of the invention has the best resolution in tracking different charged particles compared to earlier semiconductors and earlier scintillators because of better intrinsic energy resolution and better count rate capability. The resolution compared to the conventional scintillation detectors and semiconductor detectors is expected to be improved with a factor of ten.

Test show that the pulse height distribution obtained for the background signals remain in the region of very low amplitudes in contrast to pulses created by ions exhibiting significantly higher amplitudes. Due to this, ion generated signals are easily identified on top of background signals generated by photons, neutrons or minimum ionizing particles.

Applications for the invention is e.g. in High Temperature Plasma Diagnostics for a fusion reactor, wherein a Neutral Particle Analyzer (NPA) is needed. Another application is for Neutron detection in connection to e.g. Alpha Particle Induced reactions, Spontaneous Fission and Induced Fission. Still further possible applications are for Low energy X-ray detection, for High Energy X- and gamma-ray detection and for detection of Low energy heavy ions.

In the following, the invention will be described by means of an illustrative figure and an application example. The invention is, however, restricted to the details of these examples.

BRIEF DESCRIPTION OF THE DRAWINGS

FIG. 3 shows a table presenting the dependency between the energy of the particles to be measured vs thickness of the sensitive layer in the detector of the invention.

DETAILED DESCRIPTION OF THE PREFERRED EMBODIMENT

Figure 1:
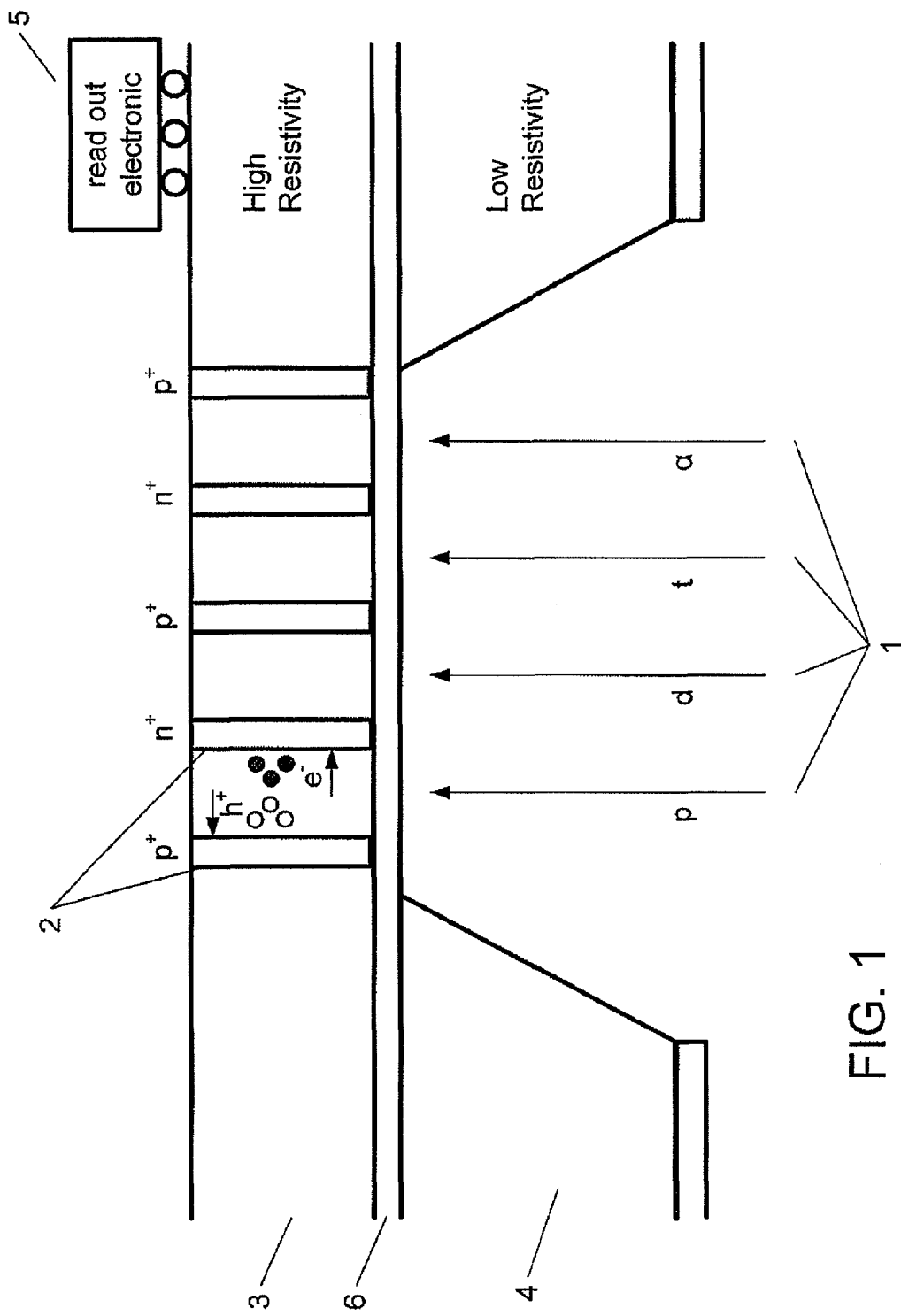
FIG. 1 is a schematic view of the detector of the invention.

FIG. 1 is a schematic view of the detector of the invention. The radiation 1 to be detected with the detector of the invention enters the detector as shown in FIG. 1 through an entrance window in a low-resistivity silicon layer 4. The radiation 1 consists of p (protons), d (deuterons), t (tritons) and α particles as well as n (neutrons) and γ particles. It is only the only the α alpha, p protons, d deutrons, and t tritons that are of interest in the invention, the signals generated by the neutrons and gamma particles should be eliminated.

After having entered the entrance window, the radiation passes the thin passivation layer 6 made of silicon dioxide. This layer is a protective layer that forms a hermetic seal over the circuit elements. This intermediate passivation layer 6 separates the high and low resistivity layers from each other, the thickness being as thin as what is possible from a manufacture view. The function of the passivation is to neutralized the surface charge of the sensitive volume (High resistivity silicon) and it is needed to be thin to avoid the absorption of the particles before they reach the sensitive volume of the detector.

The backside window passivated with an appropriate insulator material (plasma nitride and silicon dioxide are the materials primarily used for passivation) has, however, usually a thickness set by the specific application.

The α, p, d, and t particles stop in the sensitive volume 3, while the rest of the particles, i.e. the n and γ particles pass through. The sensitive volume 3 is of high resistivity silicon and is the part of the detector that is used to detect the particles. In the sensitive volume of the detector they will stop and deliver all they energy to the detector and this will produce a signal proportional to the energy of the particle absorbed.

With a high resistivity, there will be a low leakage current. If there would be a high leakage current, the signals resulting from the particles could not be detected. The thickness of the passivation layer 6 and the sensitive high-resistivity layer is altogether about 1-100 μm, preferably 1-50 μm.

A three-dimensional array of electrodes 2 (five electrodes illustrated in FIG. 1) penetrate into the detector bulk 3, which is made of Silicon and is the sensitive volume interacting with the entrance radiation 1 as shown in FIG. 1. The positive electrodes are marked with p and the negative electrodes with n. The + sign here means that both materials of the electrodes have been doped very high.

Heavy ions of the entrance radiation reach the array of electrodes 2 trough an entrance window in the backside surface of the substrate material 4 of silicon. This volume of low resistivity is needed, because there will be a lot of radiation absorbed in this part of the detector. The accumulated charge would destroy this detector without draining this part. Making this substrate 4 of low resistivity and connecting it to ground will allow draining all the charge accumulated there. The thickness of the substrate 4 is about 300 μm.

Any radiation absorbed in the detector will produce electron and holes in the sensitive volume. In this example, an alpha particle produces an impact ionization, which generate an equal number of electrons and holes. The electrons move against the positive electrode and the holes move to the negative electrode as charges of equal sign repeal each other and charges of opposite sign attract each other.

The ions interact in the material bulk 3 and will generate electron-hole pairs in a number proportional to their energy. Then, the electron-holes pairs are separated by the electric field generated between the different electrodes 2. The charges drift to the electrodes 2 and a signal is generated into the readout electronic 5.

The electrodes 2 are biased to create an electrical field that sweeps the charge carriers through the bulk 3 parallel to the wafer surface 4. The electrons and holes are then collected at oppositely biased electrodes 2. The aim is to set the maximum drift, x, and depletion distance, W, by the electrode spacing rather than by the detector thickness as in the more conventional planar technology. With an appropriate electric field the collection time can be smaller than 1ns.

The advantage of this structure is that the detector has to be depleted only from one column electrode to the adjacent opposite polarity column electrode in order to deplete fully a detector of any thickness. The distance between the two column electrodes is determined by the desired spatial resolution of the detector. The thickness of the detector bulk is set in order to detect the total energy of charged ions and to reduce the background from gamma particles. The total thickness of the passivation and sensitive layers are selected as a function of the mean free path of the particles to be detected.

The backside surface 6 of the passivation layer is thinned to the desired thickness depending on the specific application. Another option is to fully etch the passivation layer inside the entry window and then grow or deposit a new one with the desired thickness. The silicon material left around the window opened to allow the entrance of the ions is used as support of the whole device and to sit the read out electronic. The read out electronic 5 is connected to the electrodes 2 by bump bonding technology.

The electric field for full depletion operation is horizontal, sustained between columns, and therefore there is no need for a backside metal contact. The only layer at the input window is a passivation layer to reduce surface leakage that can be as thin as less than 1 nm.

FIGS. 2a-2h present a possible fabrication process of the detector of the invention.

Figure 2A:
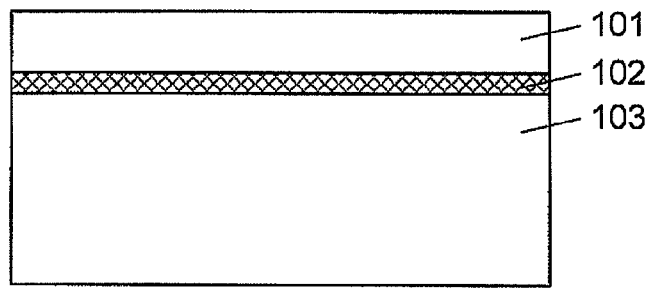
FIGS. 2*a*-2*j* present the fabrication process of the detector of the invention.

A commercial semiconductor-on-insulator (SOI) wafer illustrated in FIG. 2a can be used for the fabrication process. The silicon wafer used in this example has n-type Silicon 101, 103 layers on both sides of a Silicon oxide layer 102. The thickness of the high-resistivity layer is selected as a function of the mean free path of the particles to be detected.

Figure 2B:
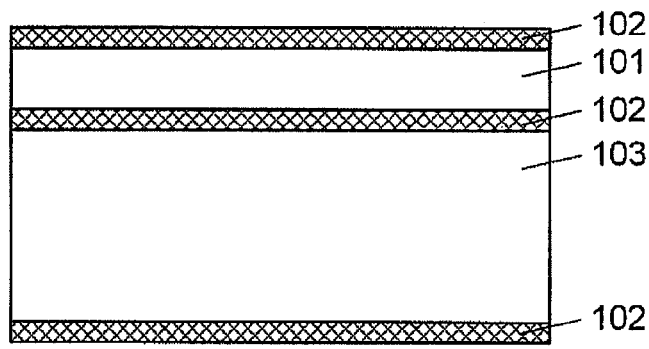

The wafer is first cleaned of any impurity and then an insulator layer 102 is growth or deposited on both surfaces (FIG. 2b).

Figure 2C:
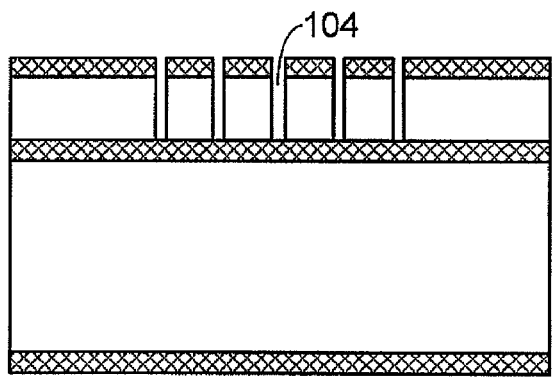

Cylindrical holes 104 (or any other suitable shape) are etched into the silicon wafer. The first set of holes is etched trough the detector surface either by MEMS processing techniques or any other suitable process. The holes will reach the oxide layer of the SOI substrate. (FIG. 2c)

Figure 2D:
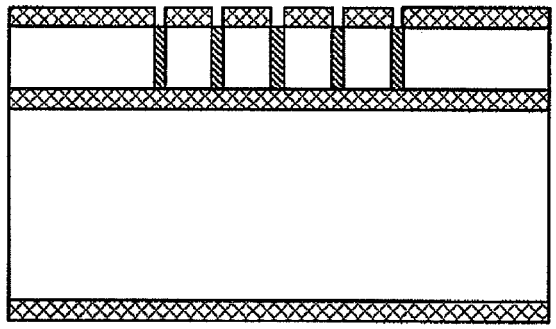

Contact must be formed inside the holes. The holes are therefore doped to create p-i-n diodes. One way to do it is to fill the holes with polysilicon doped with Boron or phosphorus. The polysilicon must be removed from the surfaces of the wafer and left only inside the holes. (FIG. 2d)

Figure 2E:
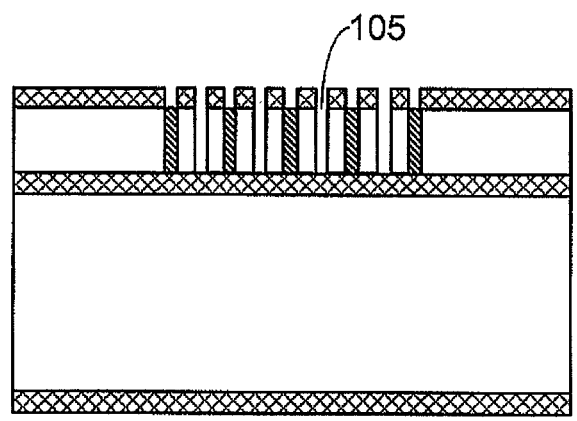

The second set of holes 105 is etched into the detector surface by MEMS processing techniques or any other suitable process. The holes will reach the oxide layer 102 of the SOI substrate. (FIG. 2e)

Figure 2F:
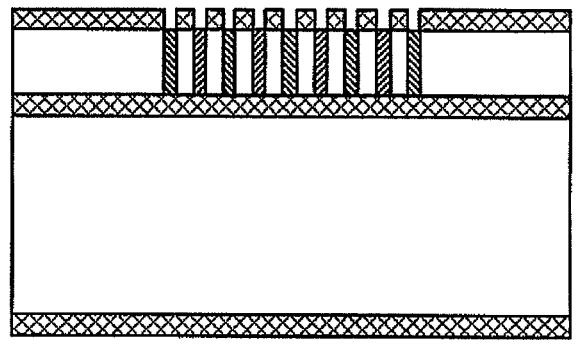

Contact must be formed inside the second set of holes. The holes are therefore doped to create p-i-n diodes. One way to do it is to fill the holes with polysilicon doped with Boron or phosphorus. The polysilicon must be removed from the surfaces of the wafer and left only inside the holes. (FIG. 2f)

Figure 2G:
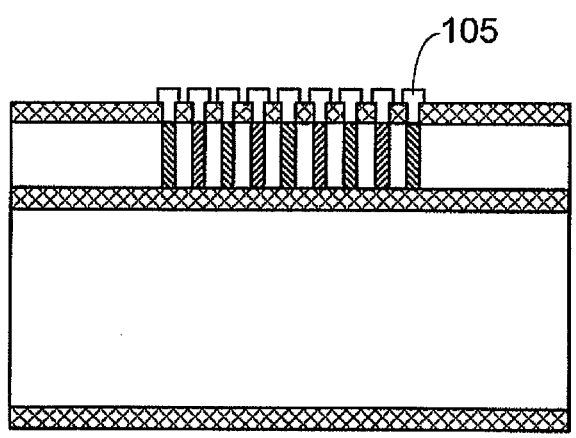

The contacts with both types of columns will be formed by depositing and patterning a metal layer, and the front surface of the wafer could be protected with a passivation layer. The contact will be routed by metal line to the read out electronic which will seat on a side of the detector. (FIG. 2g)

Figure 2H:
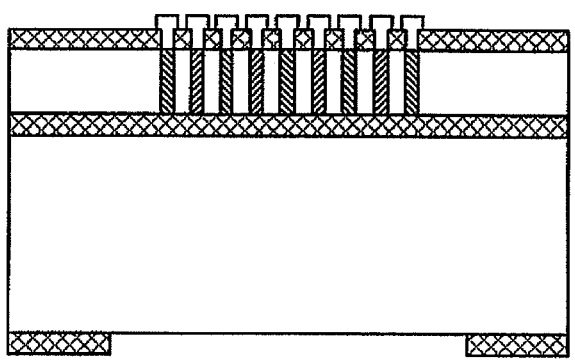

A window 107 in the back side insulation layer is opened. The window will correspond to the active area of the detector. (FIG. 2h)

Figure 2I:
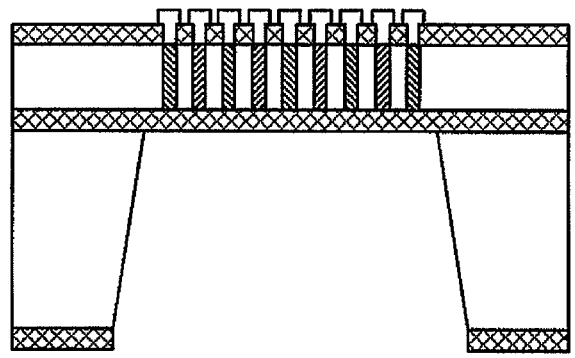

The area corresponding to the window 107 opened in the foregoing step is etched by a suitable process, as reactive ion etching or anisotropic wet chemical etching to reach the oxide layer of the SOI wafer (FIG. 2i)

Figure 2J:
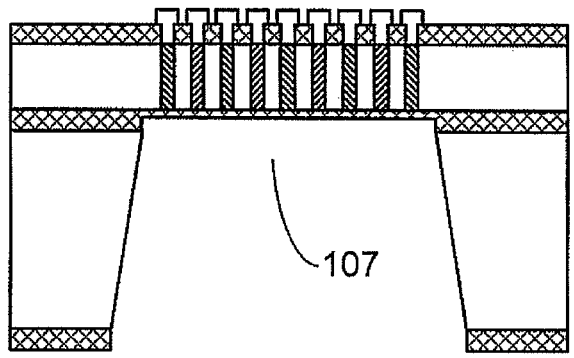

Finally, the oxide layer of the entrance window 107 is thinned to the desired thickness. Alternatively, it can be fully etched and a new layer is grown or deposited. (FIG. 2j)

In the invention the thickness of the sensitive layer is selected as a function of the mean free path of the particles to be detected. With mean free path is meant the range or traversing length of the particles with a certain energy.

FIG. 3 shows a table presenting a possible the dependency relation between the energy of the particles to be measured vs thickness of the sensitive layer in the detector of the invention. The table has the range (mean free path) of particles in Silicon. Range means how much thickness they can traverse in silicon material with respect to the particles energies.

The units used in the table in FIG. 3 are time microns, nanometers and Angstroms. Microns is equal to 10000 Angstroms (ten thousands). In the detector language, microns are usually used, for the entrance window nanometers are more common. Finally for the range of particles with very low energies, tens of keV is more practical to express in Angstroms. This table has two main categories particles type and its energies. In each box, the two values the top mean the sensitive layer thickness (in the way it is selected in practice) for that particular energy and particle; the bottom value correspond to the mean free path or range in silicon.

Figure 4:
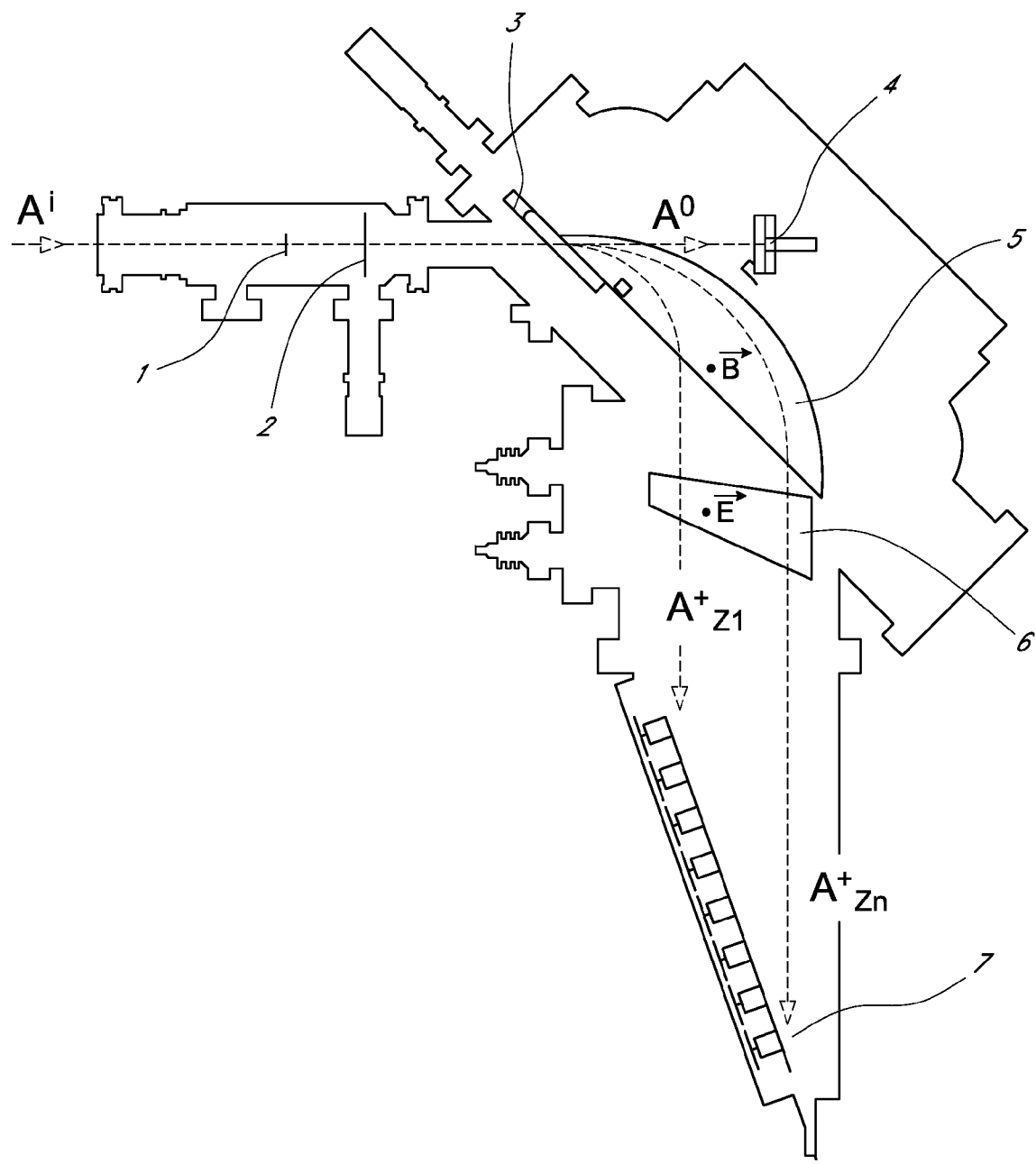
FIG. 4 is an overall view of a device, wherein the detector of the invention can be implemented.

FIG. 4 is an overall view of a device, wherein the detector of the invention can be implemented.

Neutral atoms enter the diagnostic system of FIG. 2 through a horizontal aperture 1 of some millimeters in size and a vertical aperture 2. The neutral atoms are then ionized by a thin carbon foil 3 placed in their flight path. There is one detector 4 placed in the path for those ionized particles that are in a direct channel for aligning purposes.

The resulting charged particles of this ionized stream are the particles to be detected. Different energies and masses are separated by parallel magnetic and electric fields applied in chamber 5. The active volume of the radiation reach temperatures of 100-300 Millions degree, so if this hot gas touch the walls of the reactor they would melt. To prevent the gas from touching the walls a magnetic field is used to confine the gas. So the plasma moves without touching the walls inside a tube in the reactor, the tube having the shape of an arc. Reference 6 shows the means for applying the electrical filed. The particles are detected by detectors 7 of the invention placed to detect particles of different paths depending on mass and energy.

Because of the magnetic field, no charged particles can separate from the plasma, but the intention is to measure the temperature, density, position of burned fuel and many other parameters of the particles in the plasma.

Neutral particles was injected and those neutral particles interact with the charged particles in the plasma and exchange electrons and those neutral particles that become charged (cannot go out) and those charged who receive the electrons become neutral (i.e. can go out, but with the information to be measured (temperature etc). So the particles now leaving the plasma are neutrals ($A^0$) and need to be changed again to be charged to detect using the NPA.

So after the charged particles, like $He_0$, have passed, the stripping foil 3 losses the electrons and become charged and then we can use the magnetic field and the electric field to sort the particles in different boxes 7 (detectors of invention). Particles with very high energy have longer trajectories and those with low energy small and more bended trajectories. In this way you can get many particles in the first detector and so on till the last box. Then a plot can be drafted with the number of particles in respective detector.

The particles that hit the detector are those charged particles which came after the bending magnet. The neutral particles continue in straight lone trajectory after the stripping foil 3.

What is claimed is:

1. A detector for detecting signals derived from charged particles incident thereon, the charged particles comprising at least one of protons, deuterons, tritons, and α-particles, and for distinguishing signals caused from the charged particles interacting with the detector from background radiation containing neutron and gamma particles, the detector comprising:
a silicon wafer having an entrance opening etched through a low-resistivity layer of silicon;
a sensitive layer of high-resistivity silicon for converting the radiation particles into detectable charges;
a passivation layer between the low-resistivity layer and the sensitive layers of high-resistivity silicon;
a plurality of electrodes built in the form of vertical channels for collecting the charges etched into the sensitive layer of high-resistivity silicon; and
read-out electronics for generating signals from the collected charges,
wherein the detector is constructed to take in the charged particles to be detected directly through the passivation layer and wherein the thickness of the sensitive layer of high-resistivity silicon has been selected as a function of the mean free path of the charged particles to be detected.

2. The detector of claim 1, further comprising a polyethylene moderator at the entrance window for detection of neutrons.

3. The detector of claim 2, wherein the electrodes comprise polysilicon and are of n and p type.

4. A method of manufacturing the detector of claim 3 from a semiconductor-on-insulator (SOI) wafer, the wafer comprising two outmost layers of n-type silicon and an intermediate layer of silicon dioxide, the method comprising:
selecting the thickness of one of the silicon layers to be the sensitive layer at the front surface as a function of the mean free path of the particles to be detected;
growing or depositing an insulation layer on both surfaces of the wafer by leaving open a window;
etching holes in the sensitive layer to reach the silicon oxide layer;
doping the holes to create electrodes;
depositing and patterning a metal layer at the front surface of the wafer and routing the metal layer to read-out electronic; and
forming a window in the back surface of the wafer to reach the silicon oxide layer.

5. A method of using the detector of claim 3 for detecting charged particles, the method comprising:
causing the charged particles to enter through an entrance window into the detector;
ionizing neutral atoms within the sensitive layer of high-resistivity silicon;
applying a voltage between electrodes etched into the sensitive layer of high resistivity silicon; and
detecting signals at the electrodes with read-out electronics.

6. The detector of claim 2, wherein the electrodes comprise a Schottky contact.

7. The detector of claim 3, wherein the electrodes comprise a Schottky contact.

8. A method of manufacturing the detector of claim 2 from a semiconductor-on-insulator (SOI) wafer, the wafer comprising two outmost layers of n-type silicon and an intermediate layer of silicon dioxide, the method comprising:
selecting the thickness of one of the silicon layers to be the sensitive layer at the front surface as a function of the mean free path of the particles to be detected;
growing or depositing an insulation layer on both surfaces of the wafer by leaving open a window;
etching holes in the sensitive layer to reach the silicon oxide layer;
doping the holes to create electrodes;
depositing and patterning a metal layer at the front surface of the wafer and routing the metal layer to read-out electronic; and
forming a window in the back surface of the wafer to reach the silicon oxide layer.

9. A method of using the detector of claim 2 for detecting the charged particles, the method comprising:
causing the charged particles to enter through an entrance window into the detector;
ionizing neutral atoms within the sensitive layer of high-resistivity silicon;
applying a voltage between electrodes etched into the sensitive layer of high-resistivity silico; and
detecting signals at the electrodes with read-out electronics.

10. A method of manufacturing the detector of claim 2 from a semiconductor-on-insulator (SOI) wafer, the wafer comprising two outmost layers of n-type silicon and an intermediate layer of silicon dioxide, the method comprising:
selecting the thickness of a high-resistivity silicon layer as a function of the mean free path of the charged particles to be detected for distinguishing signals caused by said charged particles from background radiation containing neutrons and gamma particles;
growing or depositing an insulation layer on both surfaces of the wafer;
etching holes in the high-resistivity silicon layer;
doping the holes to create p-i-n diodes;
etching a second set of holes in the high-resistivity layer;
doping the second set of holes to create p-i-n diodes
depositing and patterning a metal layer at the front surface of the wafer and routing the metal layer to read-out electronics; and
forming a window in the back surface of the wafer to reach the silicon dioxide layer.

11. The detector of claim 1, wherein the electrodes comprise polysilicon and are of n and p type.

12. The detector of claim 11, wherein the electrodes comprise a Schottky contact.

13. A method of manufacturing the detector of claim 11 from a semiconductor-on-insulator (SOI) wafer, the wafer comprising two outmost layers of n-type silicon and an intermediate layer of silicon dioxide, the method comprising:
selecting the thickness of one of the silicon layers to be the sensitive layer at the front surface as a function of the mean free path of the particles to be detected;
growing or depositing an insulation layer on both surfaces of the wafer by leaving open a window;
etching holes in the sensitive layer to reach the silicon oxide layer;
doping the holes to create electrodes;
depositing and patterning a metal layer at the front surface of the wafer and routing the metal layer to read-out electronic; and forming a window in the back surface of the wafer to reach the silicon oxide layer.

14. A method of using the detector of claim 11 for detecting the charged particles, the method comprising:
   causing charged particles to enter through an entrance window into the detector;
   ionizing neutral atoms within the sensitive layer of high-resistivity silicon;
   applying a voltage between electrodes etched into the sensitive layer of high-resistivity silicon; and
   detecting signals at the electrodes with read-out electronics.

15. The detector of claim 1, wherein the electrodes comprise a Schottky contact.

16. A method of manufacturing the detector of claim 1 from a semiconductor-on-insulator (SOI) wafer, the wafer comprising two outmost layers of n-type silicon and an intermediate layer of silicon dioxide, the method comprising:
   selecting the thickness of one of the silicon layers to be the sensitive layer at the front surface as a function of the mean free path of the particles to be detected;
   growing or depositing an insulation layer on both surfaces of the wafer by leaving open a window;
   etching holes in the sensitive layer to reach the silicon oxide layer;
   doping the holes to create electrodes;
   depositing and patterning a metal layer at the front surface of the wafer and routing the metal layer to read-out electronic; and
   forming a window in the back surface of the wafer to reach the silicon oxide layer.

17. A method of using the detector of claim 1 for detecting the charged particles, the method comprising:
   causing the charged particles to enter through an entrance window into the detector;
   ionizing neutral atoms within the sensitive layer of high-resistivity silicon;
   applying a voltage between electrodes etched into the sensitive layer of high resistivity silicon; and
   detecting signals at the electrodes with read-out electronics.

18. The detector of claim 1, wherein the detector is a portion of at least one of a Neutral Particle Analyzer (NPA), a neutron detector in connection to Alpha Particle Induced reactions, Spontaneous Fission, Induced Fission, a Low energy X-ray detector, a High Energy X-and gamma-ray detector, and a Low energy heavy ion detector.

19. The detector of claim 1, wherein the thickness of the low-resistivity silicon layer is about 1 to 100 µm.

20. The detector of claim 1, wherein the thickness of the low-resistivity silicon layer is about 300 µm.

21. The detector of claim 20, further comprising a polyethylene moderator at the entrance opening in the sensitive layer of high-resistivity silicon for detection of neutrons.

22. A method of manufacturing a detector for detecting signals derived from charged particles incident thereon from a semiconductor-on-insulator (SOI) wafer, the wafer comprising two outmost layers of n-type silicon and an intermediate layer of silicon dioxide, the method comprising:
   selecting the thickness of one of the silicon layers to be a sensitive layer at a front surface as a function of the mean free path of the charged particles to be detected;
   growing or depositing an insulation layer on both surfaces of the wafer by leaving open a window;
   etching holes in the sensitive layer to reach the silicon oxide layer;
   doping the holes to create electrodes;
   depositing and patterning a metal layer at the front surface of the wafer and routing the metal layer to read-out electronic; and
   forming a window in the back surface of the wafer to reach the silicon oxide layer.

23. A method of using a detector for detecting signals derived from charged particles incident thereon, the method comprising:
   causing the charged particles to enter through an entrance window etched through a low-resistivity layer of silicon into the detector;
   ionizing neutral atoms within a sensitive layer of high-resistivity silicon;
   applying a voltage between electrodes etched into the sensitive layer of high resistivity silicon; and
   detecting signals at the electrodes with read-out electronics.

* * * * *

UNITED STATES PATENT AND TRADEMARK OFFICE
CERTIFICATE OF CORRECTION

PATENT NO. : 8,461,541 B2  Page 1 of 1
APPLICATION NO. : 12/794627
DATED : June 11, 2013
INVENTOR(S) : Garcia et al.

It is certified that error appears in the above-identified patent and that said Letters Patent is hereby corrected as shown below:

In the Claims
In column 12 at line 26, In Claim 9, change "silico;" to --silicon;--.

Signed and Sealed this
Eighteenth Day of February, 2014

Michelle K. Lee
*Deputy Director of the United States Patent and Trademark Office*